United States Patent
Chen et al.

(10) Patent No.: US 8,937,354 B2
(45) Date of Patent: Jan. 20, 2015

(54) PD SOI DEVICE WITH A BODY CONTACT STRUCTURE

(75) Inventors: Jing Chen, Shanghai (CN); Qingqing Wu, Shanghai (CN); Jiexin Luo, Shanghai (CN); Xiaolu Huang, Shanghai (CN); Xi Wang, Shanghai (CN)

(73) Assignee: Shanghai Institute of Microsystem and Information Technology, Chinese Academy of Sciences, Changning District, Shanghai (CN)

( * ) Notice: Subject to any disclaimer, the term of this patent is extended or adjusted under 35 U.S.C. 154(b) by 0 days.

(21) Appl. No.: 13/128,907

(22) PCT Filed: Sep. 8, 2010

(86) PCT No.: PCT/CN2010/076703
§ 371 (c)(1),
(2), (4) Date: May 12, 2011

(87) PCT Pub. No.: WO2012/006806
PCT Pub. Date: Jan. 19, 2012

(65) Prior Publication Data
US 2012/0205743 A1 Aug. 16, 2012

(30) Foreign Application Priority Data
Jul. 13, 2010 (CN) .......................... 2010 1 0225638

(51) Int. Cl.
| | |
|---|---|
| H01L 27/12 | (2006.01) |
| H01L 29/423 | (2006.01) |
| H01L 29/786 | (2006.01) |
| H01L 21/266 | (2006.01) |
| H01L 29/66 | (2006.01) |
| H01L 29/78 | (2006.01) |

(52) U.S. Cl.
CPC .... *H01L 29/42384* (2013.01); *H01L 29/78612* (2013.01); *H01L 21/266* (2013.01); *H01L 29/66575* (2013.01); *H01L 29/7833* (2013.01)
USPC .......................................... 257/348; 257/347

(58) Field of Classification Search
USPC .................................................. 257/347, 348
See application file for complete search history.

(56) References Cited

U.S. PATENT DOCUMENTS

| 5,637,899 A * | 6/1997 | Eimori et al. ................. 257/347 |
| 6,154,091 A * | 11/2000 | Pennings et al. .............. 327/565 |
| 6,307,237 B1 * | 10/2001 | Erstad ........................... 257/401 |

(Continued)

*Primary Examiner* — Matthew Landau
*Assistant Examiner* — Priya Rampersaud
(74) *Attorney, Agent, or Firm* — Global IP Services; Tianhua Gu (57) ABSTRACT

The present invention discloses a PD SOI device with a body contact structure. The active region of the PD SOI device includes: a body region; a gate region, which is inverted-L shaped, formed on the body region; a N-type source region and a N-type drain region, formed respectively at the two opposite sides of the anterior part the body region; a body contact region, formed at one side of the posterior part of the body region, which is side-by-side with the N-type source region; and a first silicide layer, formed on the body contact region and the N-type source region, which is contact to both of the body contact region and the N-type source region. The body contact region of the device is formed on the border of the source region and the leading-out terminal of the gate electrode. It can suppress floating body effect of the PD SOI device meanwhile not increasing the chip area, thereby overcoming the shortcoming in the prior art that the chip area is enlarged when the traditional body contact structure is employed. Furthermore, the fabrication process provided herein is simple and compatible to the CMOS technology.

12 Claims, 6 Drawing Sheets

(56) References Cited

U.S. PATENT DOCUMENTS

| | | | |
|---|---|---|---|
| 6,867,106 B2* | 3/2005 | Yamaguchi et al. | 438/331 |
| 7,135,742 B1* | 11/2006 | Harada et al. | 257/347 |
| 8,143,691 B2* | 3/2012 | Ichijo | 257/492 |
| 2001/0029078 A1* | 10/2001 | Abe | 438/280 |
| 2002/0090764 A1* | 7/2002 | Maeda et al. | 438/149 |
| 2002/0125534 A1* | 9/2002 | Kim et al. | 257/347 |
| 2003/0132464 A1* | 7/2003 | Yamaguchi et al. | 257/288 |
| 2007/0246750 A1* | 10/2007 | Azuma | 257/273 |
| 2010/0065909 A1* | 3/2010 | Ichijo | 257/343 |

* cited by examiner

PD SOI DEVICE WITH A BODY CONTACT STRUCTURE

FIELD OF THE INVENTION

The present invention relates to a Metal Oxide Semiconductor (MOS) device, and more particularly to a silicon-on-insulator (SOI) MOS device with a body contact structure which can effectively suppress floating body effect in partially-depleted SOI (PD SOI), which belongs to semiconductor manufacturing field.

BACKGROUND OF THE INVENTION

With the size of the characteristic dimension of very large scale integrated circuits continuing to shrink, new problems have arisen in the fields of material technology, device theories, device structure and fabrication process, etc. To solve these new problems, researchers adopt a series of new technologies. SOI means silicon on insulator. In SOI technique, device is fabricated in a very thin silicon film, and the device and substrate are separated by a buried oxide layer. This structure makes SOI have many advantages over bulk silicon technique. Small parasitic capacitance enable the high speed and low power consumption of the SOI device. Full dialectical isolation feature of SOI CMOS entirely eliminates the parasitic latch-up effect of bulk silicon CMOS device, and improve the integration density and the ability to resist radiation. SOI technique is widely used for RF, high voltage, and anti-radiation field and so on.

SOI MOS is divided into a partially depleted SOI MOS (PDSOI) and a fully depleted SOI MOS (FDSOI) according to whether the body region of the active area is fully depleted or not. In general, the top silicon film of the FDSOI is very thin. Thin film SOI silicon costs high and the threshold voltage of the FDSOI is hardly controlled. Therefore, the PDSOI is commonly used.

The body region of the active area of PDSOI is not fully depleted, so that the body region is suspended. The charge due to an impact ionization mechanism can not be transferred quickly, which will result in the floating body effect. As for the electrons-hole pairs created from the impact mechanism of the NMOS channel electrons, the holes migrate towards the body region. The floating effects will result in the holes accumulation and raised body region electric potential, and thus give rise to a decrease of the threshold voltage of SOI NMOS and a increase of the leakage current, resulting in a warping phenomenon of the device output characteristic curves $I_d V_d$, which is called Kink effect. Kink effect has many adverse effects to the performance and reliability of the device and circuit, so that the kink effect should be suppressed in the design of the device. For SOI PMOS, the electrons-hole pairs created from the impact mechanism is much less than that generated in SOI NMOS because of a lower holes ionization rate in SOI PMOS. Therefore, the Kink effect in the SOI PMOS is not obvious.

Figure 1A:
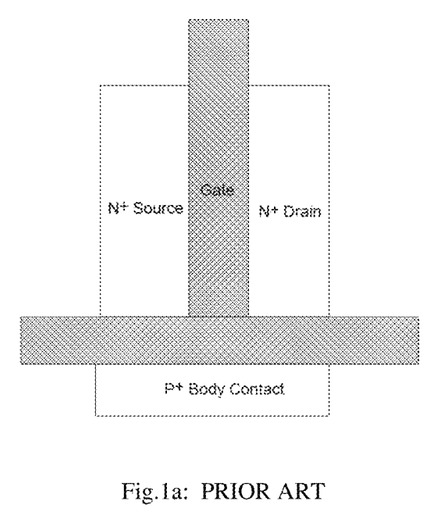
FIG. 1a is a vertical view of a structure of a MOS device using body contact technology to restrain the floating body effect in the prior art.
Figure 1B:
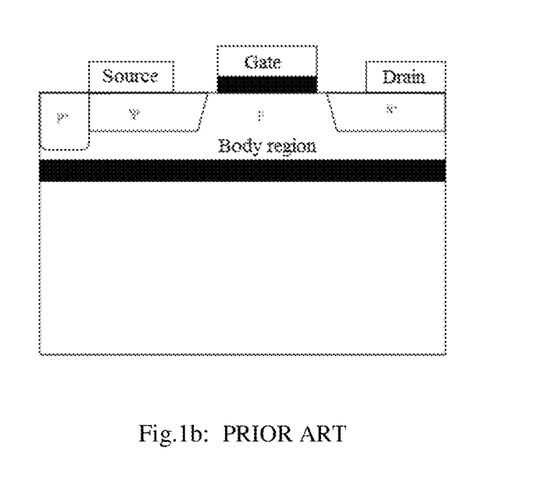
FIG. 1b is a profile of a structure of a MOS device using body contact technology to restrain the floating body effect in the prior art.

To solve the problem of partially depleting SOI NMOS, the body contact technology is widely adopted, in which the "body" contacts fixed electric potential (source or ground). FIGS. 1a-1b show traditional body contact using a T-shaped gate. At one side of the T-shaped gate, a P+ implanted region is formed and connected with the P-type body region under the gate. When the MOS device operates, charge carriers accumulated in the body region emits through the P+ channel so as to reduce the electric potential of the body region. Such a process, however, is complicated, and aggravates the parasitic effect, thus affecting partial electrical properties and enlarging the area.

Given the above, there is a need for a new body contact structure which can effectively suppress the floating body effect in the PD SOI device without enlarging the chip area, which is simple and compatible to the process of fabricating the integrated circuits.

SUMMARY OF THE INVENTION

Consistent with some embodiments of the present invention, a PD SOI device with a body contact structure is provided. The PD SOI device comprises: a semiconductor substrate, a buried insulation layer formed on the semiconductor substrate and an active region formed on the buried insulation layer; wherein the active region comprises: a body region; a gate region, which is inverted-L shaped, formed on the body region; a N-type source region and a N-type drain region, formed respectively at the two opposite sides of the anterior part the body region; a body contact region, formed at one side of the posterior part of the body region, which is side-by-side with the N-type source region; and a first silicide layer, formed on both of the body contact region and the N-type source region, which is contact to both of the body contact region and the N-type source region.

Preferably, a second silicide layer is formed on the N-type drain region and a third silicide layer is formed on the gate region. The first, second and third silicide layers are made of cobalt silicide layer or titanium silicide layer.

Preferably, the body contact region is made of heavy-doped P-type semiconductor materials and the body region is made of P-type semiconductor materials.

Preferably, the gate region is composed of a gate dielectric layer and a gate electrode formed on the gate dielectric layer, the gate electrode is made of polycrystalline silicon materials.

Preferably, a shallow trench isolation (STI) region is formed surrounding the active region and a side-wall spacer is formed surrounding the gate region.

The PD SOI device with a body contact structure provided in the present invention has the following beneficial effects: the body contact region of the device is formed on the border of the source region and the leading-out terminal of the gate electrode, without increasing device area. That is, part of the leading-out region of Poly gate electrode is used for forming body contact without affecting gate electrode leading out, thereby suppressing floating body effect of the PD SOI device. In effectively suppressing the floating body effect, the PD SOI device with a body contact structure provided in the present invention will not increase the chip area, thereby overcoming the shortcoming in the prior art that the chip area is enlarged when the traditional body contact structure is employed. Furthermore, the fabrication process provided herein is simple and compatible to the common process of fabricating the CMOS.

BRIEF DESCRIPTION OF THE DRAWINGS

FIGS. 2a-2c show the structure of a PD SOI device with a body contact structure.

DETAILED DESCRIPTION OF THE EMBODIMENTS

The present invention is further explained in detail according to the accompanying drawings.

Figure 2A:
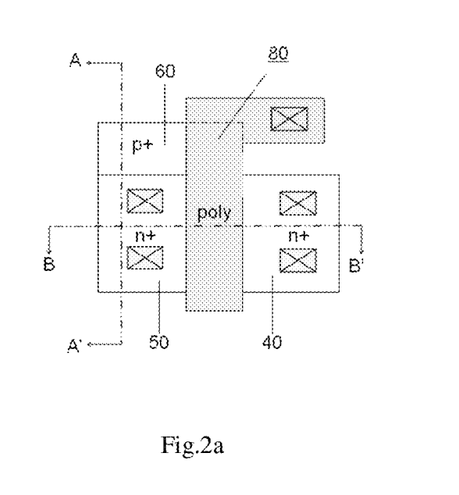
FIG. 2a is a vertical view.
Figure 2B:
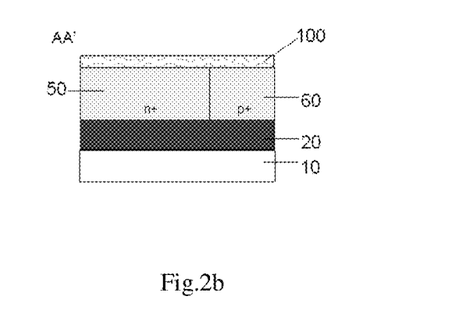
FIG. 2b and FIG. 2c show profiles in the AA' and BB' directions indicated in FIG. 2a, wherein FIG. 2a does not show the silicide layer just for convenience.
Figure 2C:
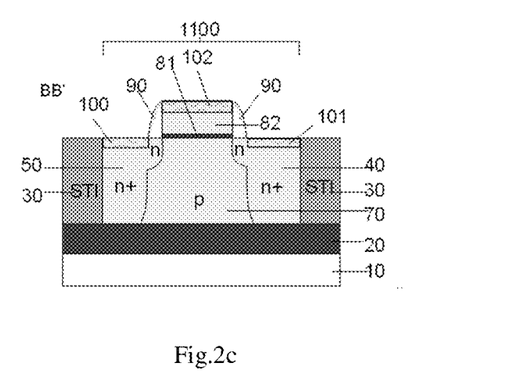

As shown in FIGS. 2a-2c, the PD SOI device with a body contact structure provided in the present invention includes: a semiconductor substrate 10, a buried insulation layer 20 located on the semiconductor substrate 10, an active region 1100 located on the buried insulation layer 20, and a STI structure 30 formed surrounding the active region 1100.

The active region 1100 includes: a gate region 80, a body region 70, an N-type source region 50, an N-type drain region 40, a body contact region 60, and a silicide layer 100. The N-type source region 50 and the N-type drain region 40 are formed opposite to each other and respectively at the two opposite sides of the anterior part of the body region 70. The body contact region 60 is located on one side of the posterior part of the body region 70 and side-by-side with the N-type source region 50, wherein the body contact region 60 and the source region 50 are of equal width in a channel length direction and are in the same side of the body region 70; and the edge of the body contact region 60 is not beyond the edge of L shaped gate region 80 in the channel width direction. The silicide layer 100 is formed on both of the body contact region 60 and the N-type source region 50, and the silicide layer 100 is contact with both of them. The gate region 80 is inverted-L shaped. Furthermore, the gate region 80 is located on the body region 70, and there is a leading-out terminal on the gate region 80 at the corresponding place of the back of the body region 70. As shown in FIG. 2a, the leading-out terminal of the gate region 80 is located on the side opposite to the body contact region 60 and towards to the posterior part of the body region 70, that is the leading-out terminal of the gate region and the body contact region are in the same side of source region and drain region and towards to the posterior part of the body region.

Preferably, a second silicide layer 101 is provided on the N-type drain region 40 and a third silicide layer 102 is provided on the gate region 80. The gate region 80 includes a gate dielectric layer 81 and a gate electrode 82 formed on the gate dielectric layer 81. A side-wall spacer 90 is formed surrounding the gate region 80. The body contact region 60 is made of heavily-doped P-type semiconductor materials. The body region 70 is made of P-type semiconductor materials. The buried insulation layer 20 could be made of silicon dioxide or silicon nitride. In a specific embodiment of the present invention, silicon dioxide is adopted. In this case, the buried insulation layer 20 is a Buried Oxide Layer (BOX). The gate electrode 82 can be made of polycrystalline silicon materials. The gate dielectric layer 81 can be made of any of the materials selected from silicon dioxide, nitrogen oxide silicon compounds ($SiO_xN_y$), carbon oxide silicon compounds, etc. As the Kink effect caused by the floating body effect is not obvious in SOI PMOS devices, the technical solution provided in the present invention is mainly concerned with SOI NMOS devices.

FIGS. 3a-3i illustrate process steps in fabricating a PD SOI device with a body contact structure.

Figure 3A:
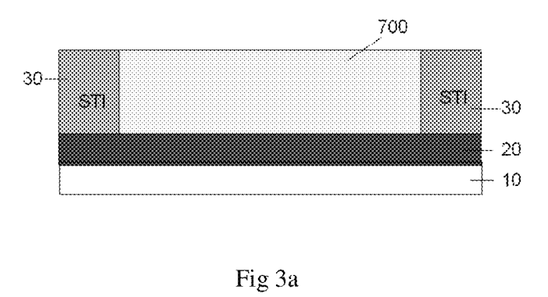
FIGS. 3a-3i describe the manufacturing process of the PD SOI device with a body contact structure, according to some embodiments of the present invention.
Figure 3B:
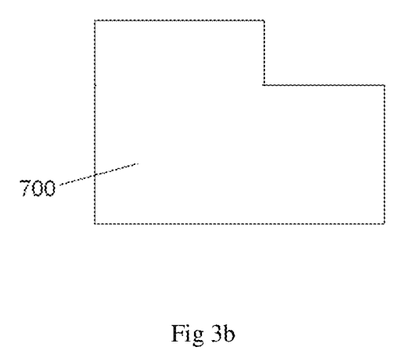

(A) as shown in FIGS. 3a-3b, provide a STI structure 30 on the Si material having a buried insulation layer 20 (PD SOI), and form a isolated Si material 700. FIG. 3a is a sectional view and FIG. 3b is a vertical view of the isolated Si material 700.

Figure 3C:
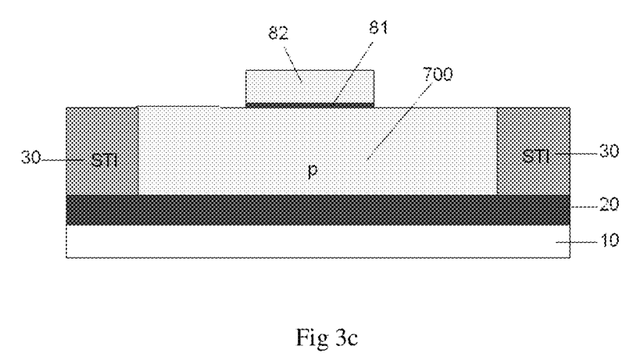
Figure 3D:
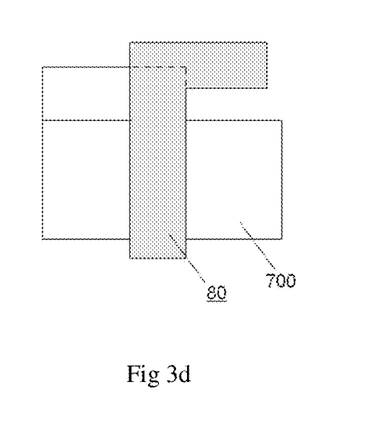

(B) as shown in FIGS. 3c-3d, fabricate a gate region 80 on the isolated Si material 700, that is, form a gate dielectric layer 81 and gate electrode 82 successively on the isolated Si material 700, wherein the gate electrode 82 is made of polycrystalline silicon material. Before forming the gate region 80, P ion implantation can be performed in the active region 1100 to regulate the threshold voltage. FIG. 3c is a sectional view and FIG. 3d is a vertical view, in which the gate region 80 is in inverted-L shape.

Figure 3E:
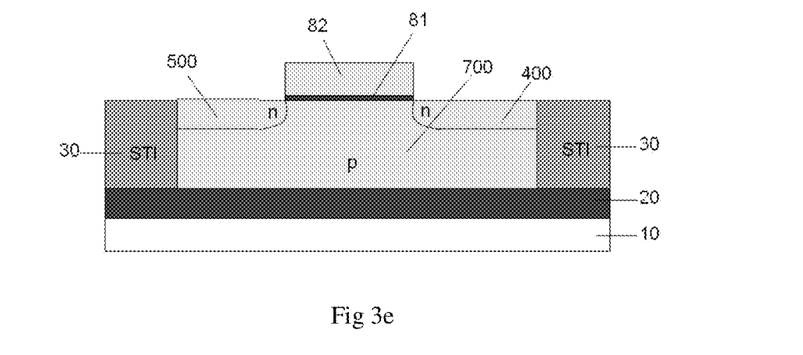

(C) as shown in FIG. 3e, perform lightly doped source (LDS) and lightly doped drain (LDD) with relatively high dose, the actual implantation does of the N-type lightly doped source and drain could reach $1e15/cm^2$ order of magnitude, which can be named as "high-doped source and drain". The lightly-doped N-type source region 500 and the lightly-doped N-type drain region 400 both have high doping concentration which actually reaches the magnitude of $1e19/cm^3$. However, in order to distinguish this process from the source and drain implantation, the terms "LDD" and "LDS" commonly used in this field are still quoted in this process.

Figure 3F:
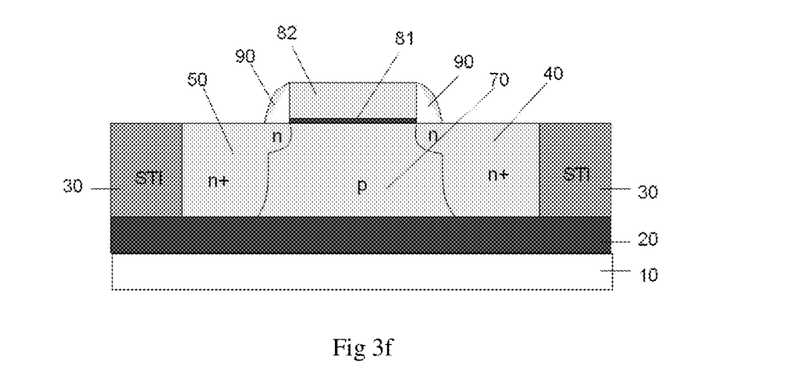

(D) as shown in FIG. 3f, provide a side isolation structure (spacer) 90 surrounding the gate region 80. The side isolation structure (spacer) 90 covers part of the surface of the lightly-doped N-type source region 500 and the lightly-doped N-type drain region 400. Then perform source and drain ion implantation to form a N-type source region 50 and a N-type drain region 40, between which a body region 70 is formed.

Figure 3G:
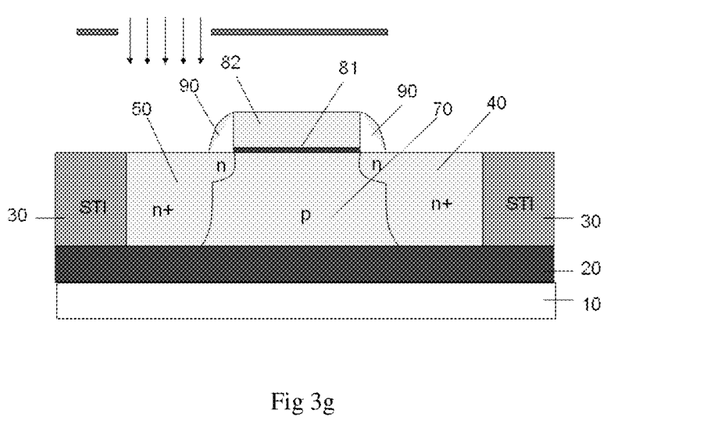
Figure 3H:
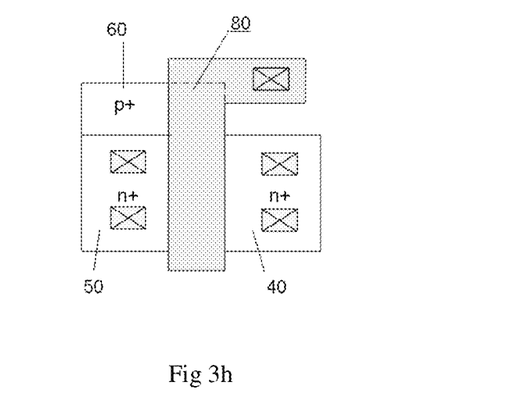

(E) as shown in FIG. 3g-3h, implant ions downward from one side of the gate region 80 at the rear of the N-type source region 50 to form a heavily-doped P-type region to form a body contact region 60. The body contact region 60 is located at one side of the rear of the body region 70, and side by side with the N-type source region 50, as shown in FIG. 3h which is a top view. In a specific embodiment, in this step, a mask with an opening at the rear position of the N-type source region 50 can be adopted. By performing heavily-doped P ion implantation vertically via the mask, the body contact region 60 can be formed.

Figure 3I:
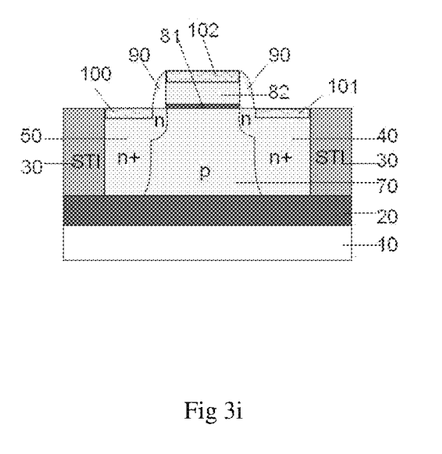

(F) as shown in FIG. 3i, form a first silicide layer (Cobalt silicide or Titanium silicide) 100 respectively above the body contact region 60 and the N-type source region 50, form a second silicide layer (Cobalt silicide or Titanium silicide) 101 above the N-type drain region 40, and then form a third silicide layer (Cobalt silicide or Titanium silicide) 102 above the gate region 80. The silicide layers 100, 101 and 102 could be fabricated adopting the following process: firstly forming metal layer (such as Co and Ti) on the surface of the device and then performing heat treatment to make the metal layer react with Si materials thereunder. Such heat treatment process is performed with the heat treating temperature ranging from 700~900° C. and heat treating time ranging from 50~70 seconds. Then, the body contact region 60 is connected with the N-type source region 50 via the silicide layer 100, which can conduct the holes accumulated in body region 70 flowing out. The silicide layers 101 and 102 simultaneous formed can be used for subsequently extraction electrodes facilitation.

The integrated MOS device could be formed by fabricating source region, drain region and gate extraction electrodes on the MOS device structure obtained by the above fabricating process and other subsequent semiconductor fabricating process. This fabrication process is simple and compatible to common CMOS fabricating process.

The PD SOI device with a body contact structure provided in the present invention has the following beneficial effects: the body contact region of the device is formed on the border of the source region and the leading-out terminal of the gate electrode, without increasing device area. That is, part of the leading-out region of Poly gate electrode is used for forming body contact without affecting gate electrode leading out, thereby suppressing floating body effect of the PD SOI device. In effectively suppressing the floating body effect, the PD SOI device with a body contact structure provided in the present invention will not increase the chip area, thereby overcoming the shortcoming in the prior art that the chip area is enlarged when the traditional body contact structure is employed. Furthermore, the fabrication process provided herein is simple and compatible to the common process of fabricating the CMOS.

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A partially-depleted silicon on insulator (PD SOI) device with a body contact structure, the PD SOI device comprises: a semiconductor substrate, a buried insulation layer formed on the semiconductor substrate and an active region formed on the buried insulation layer;

wherein the active region comprises:

a body region;

a gate region, which is inverted-L shaped, formed on the body region, leading out from a posterior part of the body region, wherein a leading-out terminal of the gate region is on one side of the body region and there is gate contact on the leading-out terminal;

a N-type source region and a N-type drain region, formed respectively at the two opposite sides of an anterior part the body region;

a body contact region, formed at one side of the posterior part of the body region, which is side-by-side with the N-type source region, wherein the body contact region and the source region are of equal width in a channel length direction and are in the same side of the body region; and the edge of the body contact region is not beyond the edge of L shaped gate region in a channel width direction; and the leading-out terminal of the gate region is located on the side opposite to the body contact region and towards to the posterior part of the body region, and the leading-out terminal of the gate region and the body contact region are in the same side of source region and drain region and towards the posterior part of the body region; and a first silicide layer, formed on both of the body contact region and the N-type source region, which is contact to both of the body contact region and the N-type source region.

2. The PD SOI device with a body contact structure of claim 1, wherein a second silicide layer is formed on the N-type drain region.

3. The PD SOI device with a body contact structure of claim 2, wherein a third silicide layer is formed on the gate region.

4. The PD SOI device with a body contact structure of claim 1, wherein the first silicide layer is made of cobalt silicide or titanium silicide.

5. The PD SOI device with a body contact structure of claim 1, wherein the body contact region is made of heavy-doped P-type semiconductor materials.

6. The PD SOI device with a body contact structure of claim 1, wherein the body region is made of P-type semiconductor materials.

7. The PD SOI device with a body contact structure of claim 1, wherein the gate region is composed of a gate dielectric layer and a gate electrode formed on the gate dielectric layer.

8. The PD SOI device with a body contact structure of claim 7, wherein the gate electrode is made of polycrystalline silicon materials.

9. The PD SOI device with a body contact structure of claim 1, wherein a shallow trench isolation structure is formed surrounding the active region.

10. The PD SOI device with a body contact structure of claim 1, wherein a side-wall spacer is formed surrounding the gate region.

11. The PD SOI device with a body contact structure of claim 2, wherein the first and the second silicide layers are made of cobalt silicide or titanium silicide.

12. The PD SOI device with a body contact structure of claim 3, wherein the first, second and third silicide layers are made of cobalt silicide or titanium silicide.

* * * * *